United States Patent [19]

Detter et al.

[11] Patent Number: 5,023,752
[45] Date of Patent: Jun. 11, 1991

[54] ELECTRICAL POWER DISTRIBUTION CENTER

[75] Inventors: Gary C. Detter, Berlin Center, Ohio; Andrew F. Rodondi, Sharpsville, Pa.; Christopher D. Burns, Niles; Samuel A. Norling, New Middletown, both of Ohio; Jay H. Garretson; Richard V. Landries, both of Warren, Ohio

[73] Assignee: General Motors Corporation, Detroit, Mich.

[21] Appl. No.: 429,943

[22] Filed: Oct. 31, 1989

[51] Int. Cl.$^5$ .............................................. H02B 1/04
[52] U.S. Cl. .................................... 361/399; 361/360; 361/412
[58] Field of Search .............. 73/29.04, 31.04, 304 C; 15/314, 321; 361/360, 412, 415, 395, 361, 399; 439/49, 51, 61, 65, 76, 74, 395, 189, 222, 594, 839; 123/549, 557

[56] References Cited

U.S. PATENT DOCUMENTS

| | | | |
|---|---|---|---|
| 4,355,853 | 10/1982 | Kourimsky | 339/17 |
| 4,688,149 | 8/1987 | Inoue et al. | 361/399 |
| 4,689,718 | 8/1987 | Maue et al. | 361/360 |
| 4,713,026 | 12/1987 | Mobley et al. | 439/845 |
| 4,747,791 | 5/1988 | Nishio | 439/638 |
| 4,811,168 | 3/1989 | Chesnut et al. | 361/426 |
| 4,894,018 | 1/1990 | Phillips et al. | 439/81 |

Primary Examiner—Leo P. Picard
Assistant Examiner—Donald A. Sparks
Attorney, Agent, or Firm—F. J. Fodale

[57] ABSTRACT

An electrical power distribution center includes stacked circuit arrays of varying current carrying capacity located between an upper housing and a lower housing, each having terminal access holes therein for receiving terminals formed on pre-stamped metal circuit elements. The terminals are selectively connected to either electrical or electronic devices carried on top of the upper housing or to wiring connectors connected to the outer surface of the lower housing. The pre-stamped metal circuit elements are removably mounted in recesses in a plurality of stacked electrical insulation boards supported within the lower housing and centered therein by guide stems formed integrally of the lower housing. Each of the electrical insulation boards includes raised surfaces thereon congruent with the recesses on an adjacent electrical insulation board for holding the metal circuit elements in place therein while insulating each of the metal circuit elements from adjacent metal circuit elements.

25 Claims, 6 Drawing Sheets

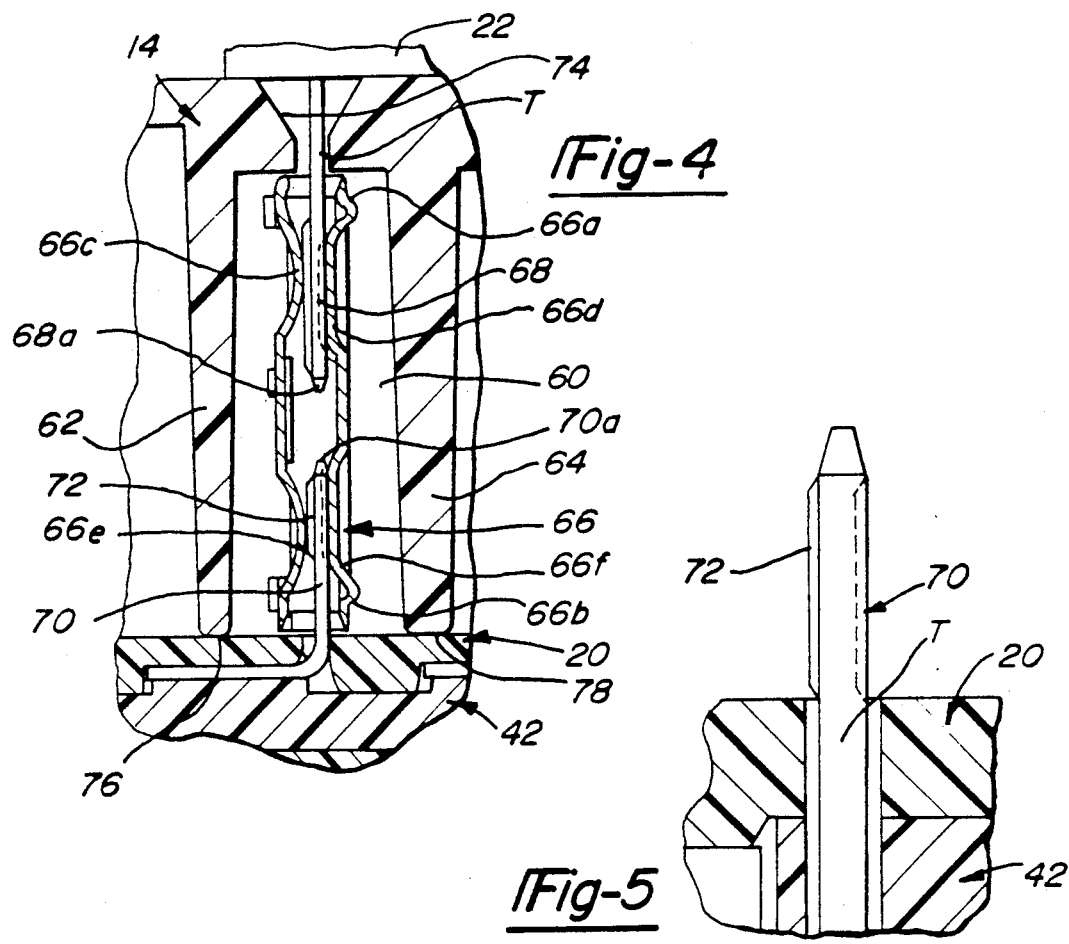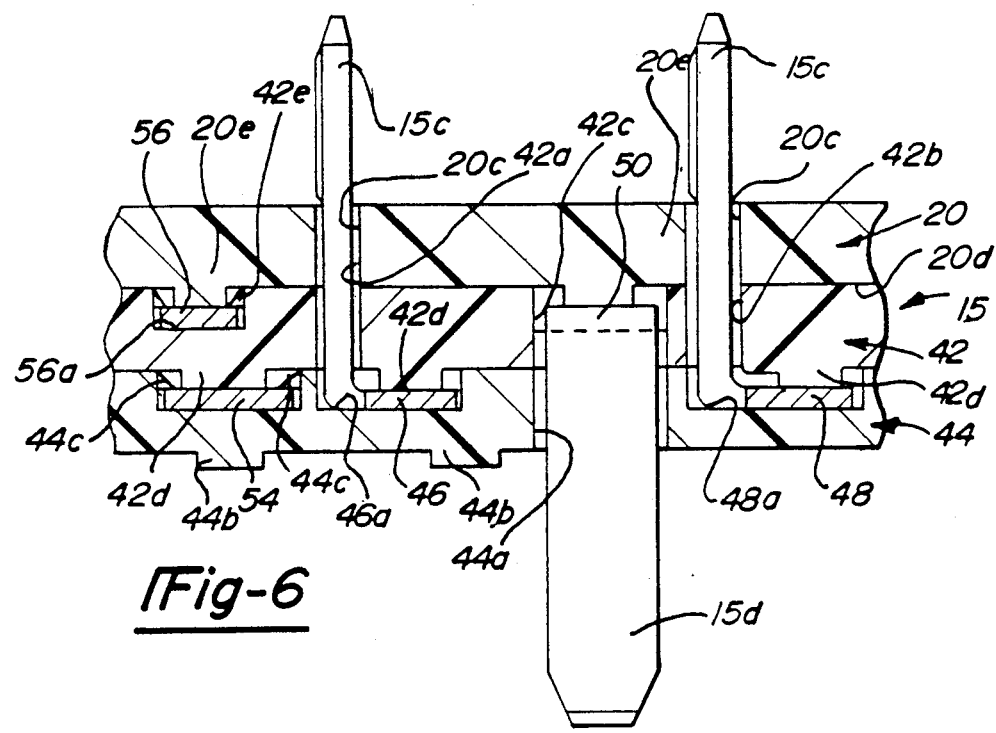

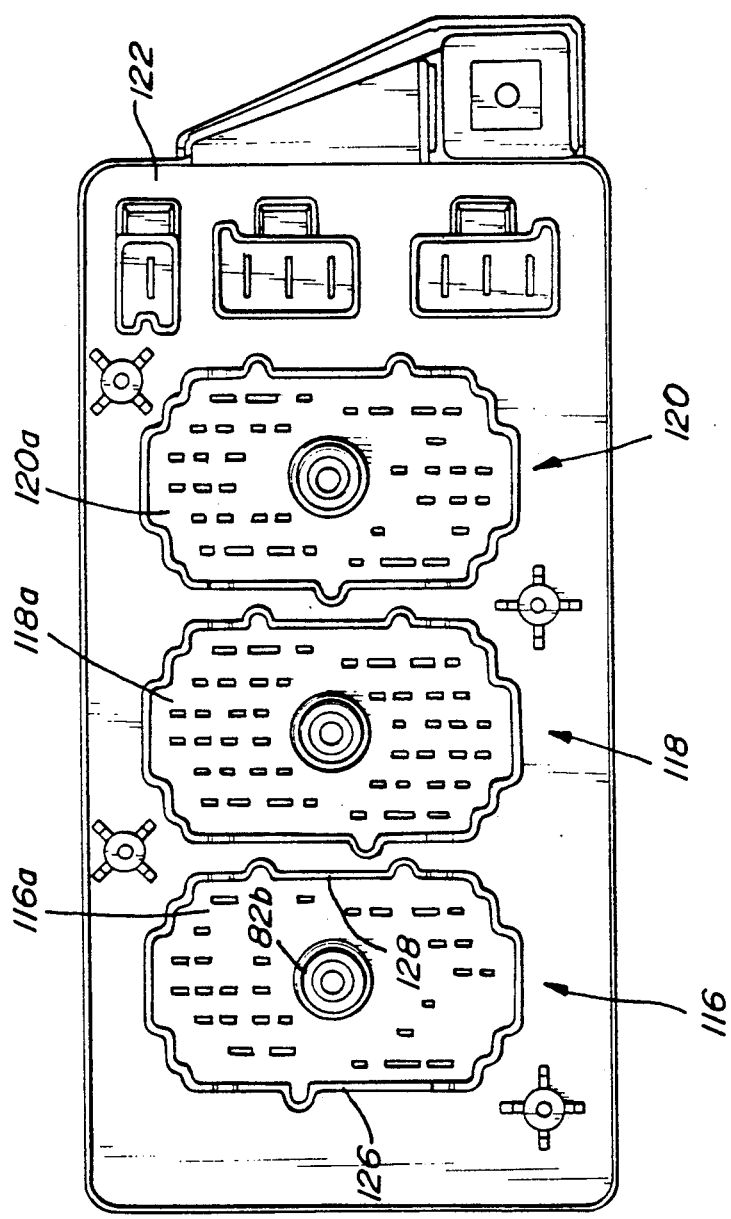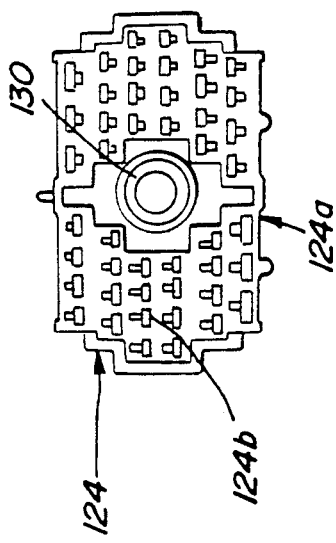

5,023,752

ELECTRICAL POWER DISTRIBUTION CENTER

FIELD OF THE INVENTION

This invention relates to electrical power distribution centers and more particularly to electrical power distribution centers for providing electrical interconnections between electrical and electronic devices and electrical wiring connections in a vehicular electrical system.

BACKGROUND OF THE INVENTION

As automotive electrical systems become more complex it has been recognized that it would be desirable to provide a junction box or power distribution center with busses therein for connecting a power source to electrical and electronic devices housed by the junction box such as relays and load protective fuses. Such junction boxes should also include provision for electrically connecting the power source and electrical and electronic devices housed by the junction box to electrical wiring harness connectors for supplying power and control signals to various electrical systems of the automobile such as air conditioning systems; fuel supply systems; lighting circuits; instrument panels and to provide signals to engine and auxiliary systems such as anti-skid brake wiring assemblies.

One such power distribution center has an electrical bus and associated printed circuit boards for electrically connecting wiring harnesses to electrical devices carried by the power distribution center. In such centers separate terminals are staked to conductive strips of the printed circuit board to provide an electrical circuit to components such as load protecting fuses. Such terminals require separate soldering steps and the components parts of the printed circuit board are not readily interchanged to adapt the center to different automotive vehicle wiring requirements.

Another approach has been to alternately stack bus bars and insulation boards in a junction box body to provide oppositely facing terminals for connection to electrical devices or wiring harness connectors to complete electrical circuits therebetween. In such cases the bus bars and insulation boards must be separately handled and centered as they are placed in the junction box body.

Yet another approach has been to provide a separate bus bar board and a separate printed circuit board in a junction box body. Relay components are located on the printed circuit board. The junction box body carries separate terminals to connect male blades on the bus bar board to printed conductor strips on the printed circuit board. Such an arrangement requires special tooling for the printed circuit board. Furthermore, separate covers are required to seal the circuit board components and fuse elements which are connected to other parts of the junction box body.

While such prior systems have been suitable for their intended purpose, one problem has been that the separate printed circuit boards, once fabricated, do not provide for adding or removing electrical circuits from the power distribution center.

The aforedescribed prior systems do not provide for centering of circuit components so that a first set of male terminals are easily connected to electrical devices on the junction box body while defining access for aligning a second set of male terminal blades which connect to a female terminator.

An object of the present invention is to provide an electrical power distribution center in which circuit layers are automatically centered as they are assembled in a housing and wherein a first set of male terminal blades on the circuit layers are arranged for connection to electrical devices on one side of the housing and a second set of male terminal blades on the circuit layers are arranged for connection to female terminators.

Another object of the present invention is to eliminate wire splices between wiring harnesses and an electrical power distribution center by providing individually stamped metal circuit components that can be added to or removed from a plurality of circuit layers disposed within a lower housing and wherein the circuit components have oppositely directed male terminal blades thereon that either connect to devices in the electrical power distribution center or to a female connector assembly that supplies power to the electrical assemblies of an automotive vehicle.

Another object of the present invention is to provide such an electrical power distribution center wherein a member is provided on one of a pair of housing components to center the circuit layers with respect to the housing components and to connect the housings together.

Yet another object of the present invention is to provide for such an electrical power distribution center wherein one of the housing components includes a plurality of recesses therein, each receiving a double ended female electrical terminal that is electrically connected to either a male terminal blade of an electrical device or to a male terminal blade formed on an individually stamped replaceable metal circuit component wherein the male terminal blades on the metal circuit components each provide a surface contact with the female electrical terminal which minimizes the force required to connect a plurality of double ended female electrical terminals to the electrical terminations of the circuit layers.

Yet another object of the present invention is to simplify assembly of a multi-layer circuit arrangement in an electrical power distribution center for distributing power between electrical devices wiring harnesses in an automotive electrical system and to do so by the provision of a plurality of circuit layers, each having an electrical insulating board with recesses therein receiving pre-stamped metal circuit components electrically insulated from one another by the electrically insulating board and wherein each pre-stamped metal circuit component is positively located by staking a portion of the board thereagainst.

A further object of the present invention is to provide an electrical power distribution center of the type set forth in the preceding paragraphs wherein the circuit layers are located in juxtaposed relationship and wherein the individual pre-stamped metal circuit components have terminals thereon which are positioned along opposed axes for connection to either electrical devices or to female terminator assemblies for connecting the electrical power distribution center to wiring harnesses in automotive electrical systems.

Still another object of the present invention is to provide such an electrical center wherein one of a pair of housing components has a plurality of members thereon for centering each of the circuit layers with respect to one another and with respect to both the first housing component and a second housing component connected thereto.

Yet another object of the present invention is to provide for such centering by members formed as hollow stems integral of the lower housing component extending therefrom in the direction of the upper housing component and having the outer surface thereof located within centering holes formed in each of the circuit layers.

A further object of the present invention is to provide for such a hollow stem arrangement wherein threaded inserts are provided within each of the centering stems for connection to threaded fasteners at either end thereof, one of which will hold lower and upper housing components together and the other of which will hold a female terminator assembly in place on one of the housings at terminal pads thereon defined by a plurality of male terminals directed from the plurality of circuit layers.

Another object of the present invention is to provide a cover for one of the housings including lo integral position assurance surfaces thereon to locate each of the electrical devices in its interface connected position when the cover is attached to the lower and upper housings.

Yet another feature of the present invention is to provide an opposite opening enclosure on one of the housing components for receiving the end wall of the cover and the other of the housing components so as to define a labyrinth path for restricting flow of ambient material from exteriorly of the electrical center into the interior thereof while permitting expansion of air from the interior of the electrical center to the exterior thereof produced by heating caused by current flow through the pre-stamped metal circuits of the juxtaposed circuit layers.

Other advantages and a more complete understanding of the invention will be more apparent from the succeeding detailed description of the invention taken with the accompanying drawings thereof.

DESCRIPTION OF THE DRAWINGS

FIG. 4 is an enlarged fragmentary sectional view of an electrical connection between circuit layers of the present invention and electrical devices thereon;

FIG. 5 is an enlarged sectional view of a male terminal blade of the electrical connection in FIG. 4;

FIG. 6 is a fragmentary enlarged sectional view of electrical insulating boards in the circuit layers of the present invention and shown in association with removable pre-stamped metal circuit components thereof;

FIG. 11 is a bottom elevational view of the present invention; and

FIG. 12 is an end elevational view of a female terminator for use with the present invention.

DETAILED DESCRIPTION OF A PREFERRED EMBODIMENT OF THE INVENTION

Figure 1:
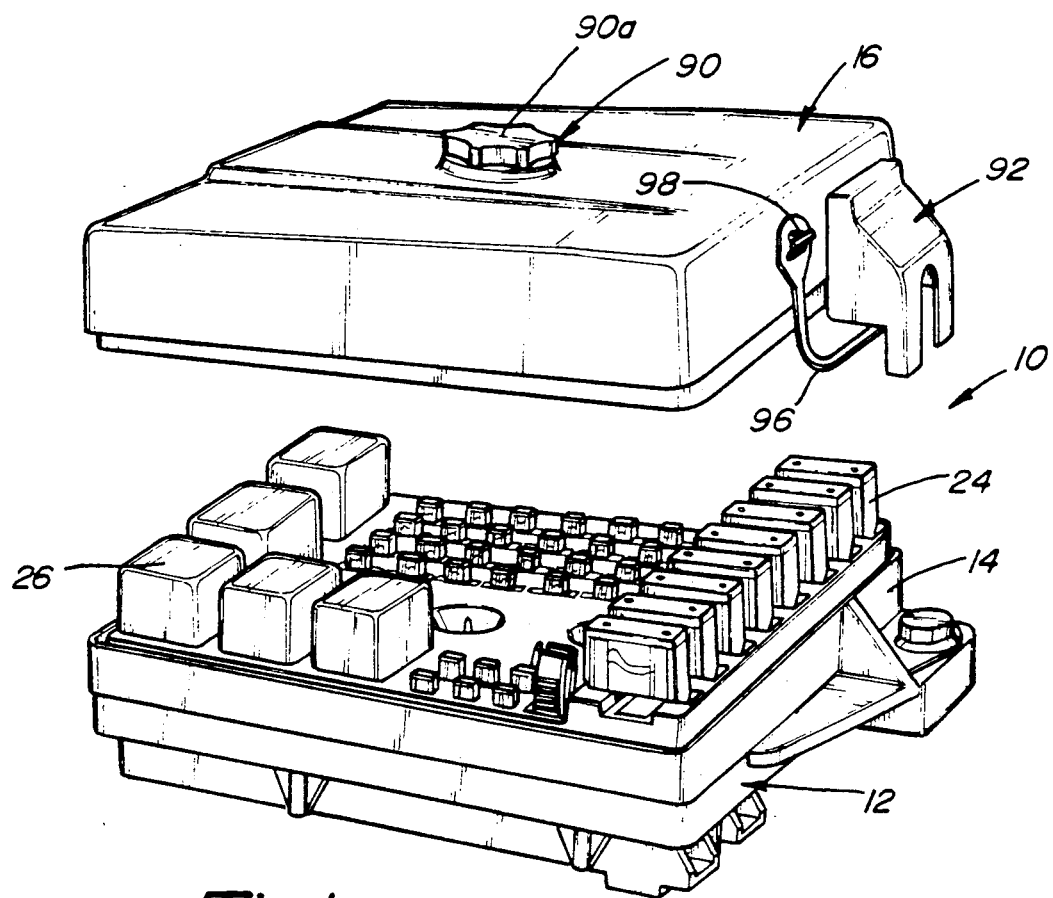
FIG. 1 is a perspective view of an electrical power distribution center of the present invention with its cover removed.
Figure 3:
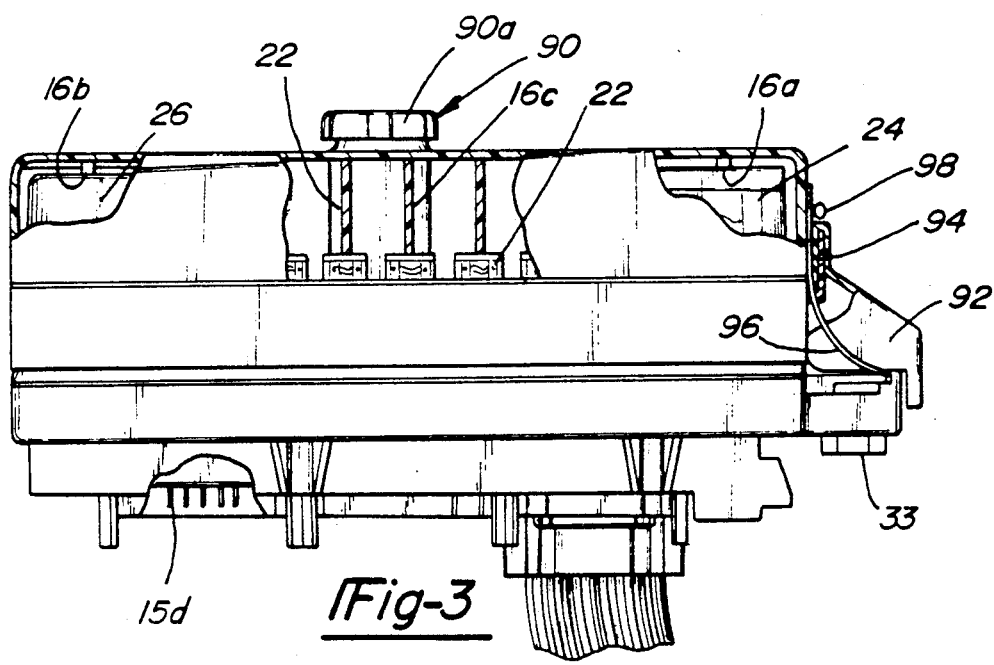
FIG. 3 is a side elevational view of the electrical power distribution center of the present invention.
Figure 2:
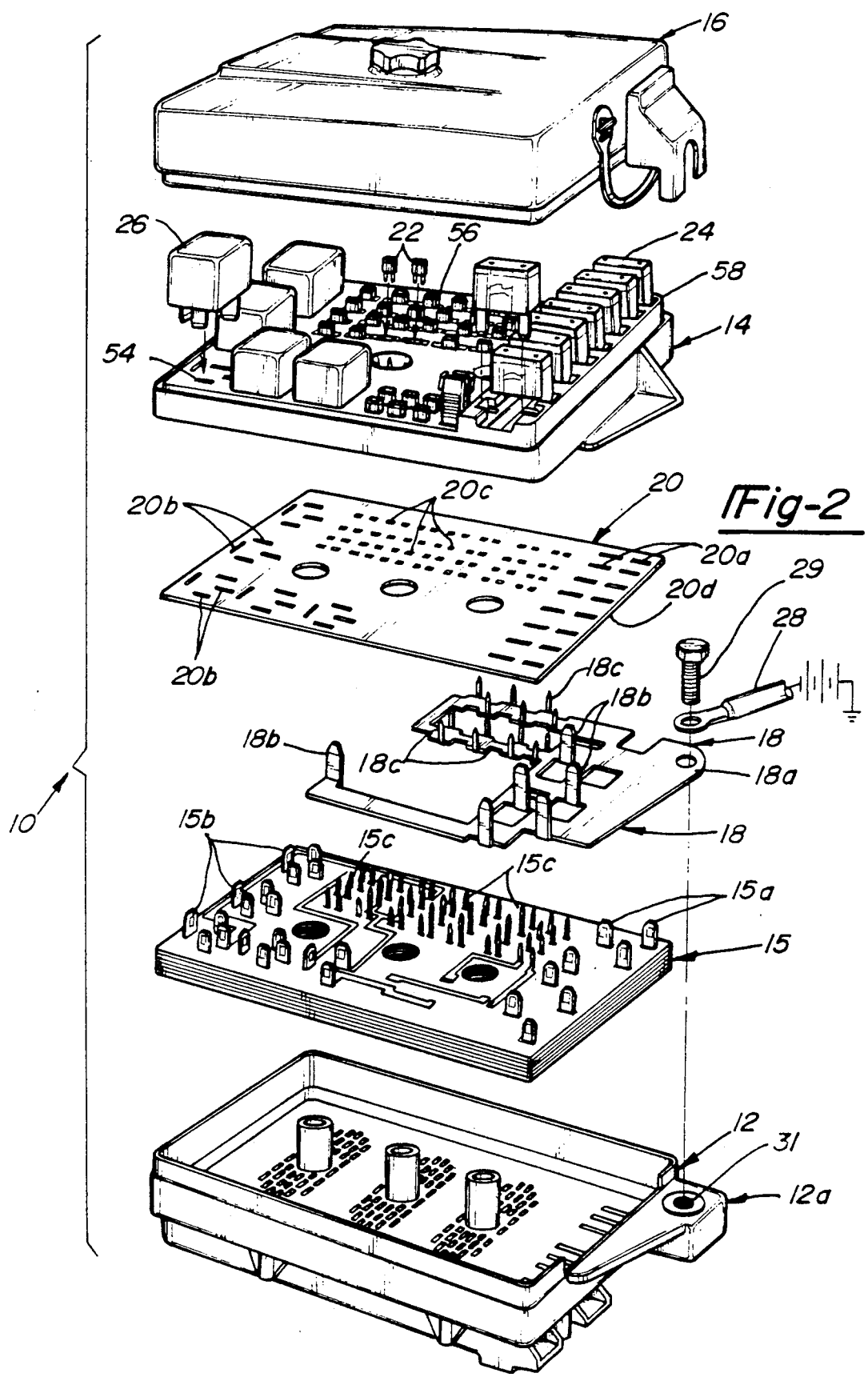
FIG. 2 is an exploded view in perspective of component parts of the electrical power distribution center of the present invention.
Figure 7:
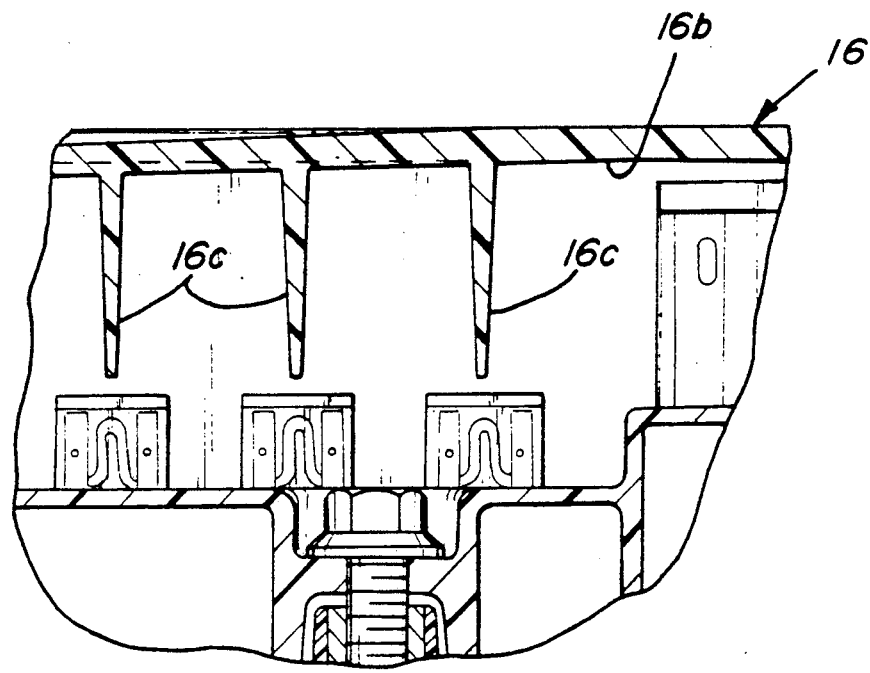
FIG. 7 is an enlarged fragmentary sectional view of the cover of FIG. 3 showing position assurance surfaces thereon.

Referring now to FIGS. 1 through 3, an electrical power distribution center 10 is illustrated having lower and upper housing members 12, 14 with a cover 16.

The housing member 12 receives a plurality of vertically stacked juxtaposed circuit layers 15 that are formed in accordance with the present invention to eliminate the needs for splices between automotive electrical harness assemblies and the electrical power distribution center 10.

Additionally, the electrical power distribution center 10 includes a power bus 18 which is covered by an electrically insulating terminal access board 20. The power bus 18 connects a battery power supply to electrical devices on housing member 14. The housing member 14 supports electronic and electrical devices including mini-fuses 22; maxi-fuses 24; and relay devices 26 that are controlled by electrical signals to position contacts for supplying power from a power source to auxiliary electrical systems of an electrical supply system for an automobile or other vehicle.

One feature of the present invention is that the power bus 18 includes an ear portion 18a that is adapted to be electrically connected to threaded cable connector 27 on the end of a cable 28 from a battery terminal by a screw 29 which threads through a threaded metal insert 31 molded in an ear portion 12a of housing 12.

The power bus 18 is a pre-stamped, flat plate of electrically conductive material that has a plurality of high capacity male terminals 18b thereon which supply power to one side of each of the maxi-fuses. Male terminal blades 15a on other circuit components of the circuit layers 15 extend through the circuit layers 15 extend through other access openings 20a in the upper terminal access board 20 to be electrically connected to the opposite sides of each of the maxi-fuses for completing an electrical circuit thereacross and through circuit components in various ones of the circuit layers 15, as will be described in greater detail below. Likewise, circuit components in the circuit layers 15 also include a plurality of upwardly directed male terminals 15b which pass through access openings 20b in the terminal access board 20 so as to electrically connect to individual ones of the relays 26 for completing the electrical circuits thereacross.

Small male terminals 18c on power bus 18 extend through access holes 20c in the terminal access board 20 to supply power to one side of the mini-fuses 22. The circuit layers 15 have a plurality of upwardly directed terminals 15c which pass through access openings 20c in the terminal access board so as to electrically connect to the other side of the mini-fuses 22 for completing a circuit thereacross.

The power bus 18 is seated against the inboard side 20d of the terminal access board 20 and forms a high amperage component in the circuit for power supply to individual replaceable pre-stamped metal circuit components within the circuit layers 15 as will be described below.

Figure 10:
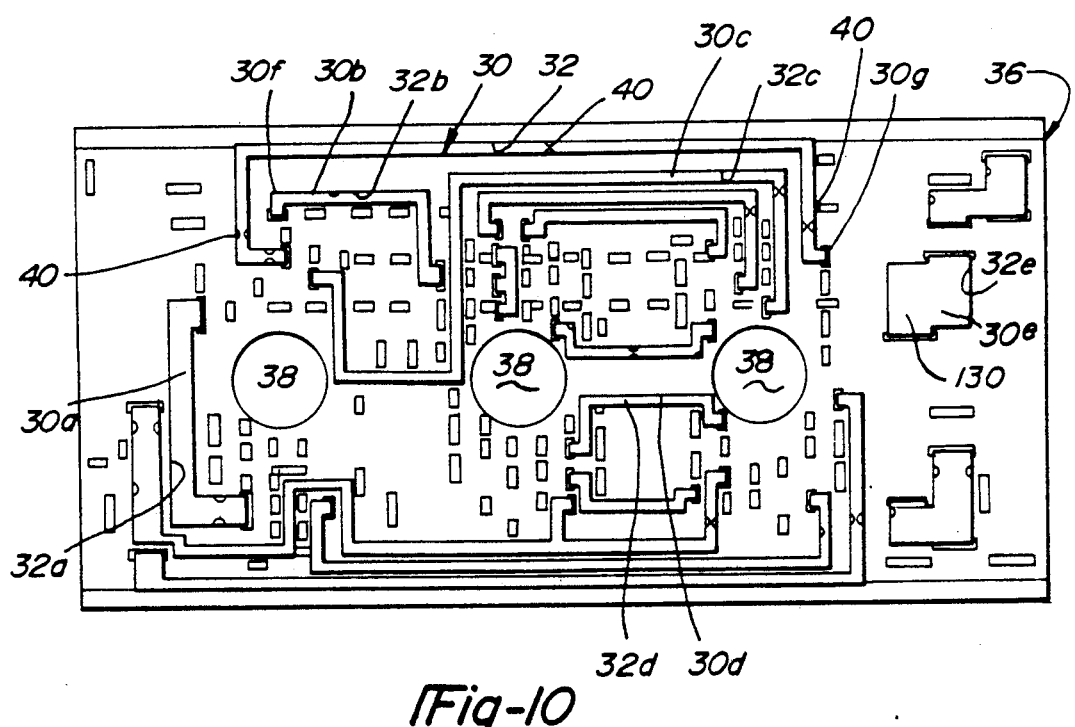
FIG. 10 is a top elevational view of one of the circuit layers in the electrical power distribution center of FIG. 2.

In accordance with certain principles of the present invention, each of the circuit layers 15 includes a plurality of separate pre-stamped metal circuit components examples of which are shown in FIG. 10 as circuit component 30, circuit and circuit component 30a, 30b, 30c, 30d, 30e, etc. Many other like replaceable pre-stamped components can be provided as shown in FIG. 10. Each of the circuit components is seated in a track or recess 32 formed in the surface 34 of an electrical insulating board 36. Each track for the previously enumerated electrical circuits 30 and 30a-30e are designated with a reference numeral 32 with a suffix letter corresponding to that of the circuit component received therein. The electrical insulating board 36 has centering holes 38 for reasons to be discussed.

Each of the circuit components 30 and 30a-30e shown in FIG. 10 includes a male terminal blade on opposite ends thereof. An exemplary case is the electrical pre-stamped metallic circuit component 30 having a male terminal blade 30f on one end thereof and a male terminal blade 30g on the opposite end thereof. One set of such male terminal blades is directed in one direction through the stack of circuit layers 15 for connection to either electrical devices such as mini-fuses 22, maxi-fuses 24 or relay devices 26 and are generally shown at reference numerals 15a, 15b and 15c in FIG. 2.

Another set of such male terminal blades formed on select ones of the circuit components is directed through the circuit layers 15 for connection to a female terminator on wiring harnesses as will be described. The second set is generally shown by reference numeral 15d in FIG. 3.

Each of the pre-stamped metal circuit components is held in a desired assembled and referenced relationship by an adjacent one of the circuit layers 15. Also, as shown with reference to metal circuit component 30, the board 36 is hot upset at 40 on either edge of the cavity or track 32 for securing the metal circuit components 30 in place therein. Like hot upset segments are provided to hold the other metal circuit components in place. The arrangement allows individual circuit components to be deleted without requiring redesign of each board.

The fragmentary view of the FIG. 6 shows the upper terminal access board 20 and two juxtaposed electrical insulating boards 42, 44 corresponding to board 36 but having a different array of pre-stamped metal circuit components which are representative of how a few of the stacked circuit layers 15 interface to one another.

The illustrated fragment of the terminal access board receives male blade terminals 15c at access holes 20c. The terminals 15c are formed on pre-stamped circuit components 46 and 48 located respectively in cavities 46a and 48a of the insulating board 44. Each of the terminals 15c is bent at right angles to their respective pre-stamped circuit components and extend upwardly through the terminal access openings 42a and 42b in the insulating board 42.

In the FIG. 6 example, board 42 has a cavity 42c that receives a pre-stamped circuit component 50 having a terminal 15d thereon extending through an access opening 44a in the electrical insulating board 44.

Each of the circuit components shown in FIG. 6 is held in place and electrically insulated by a retention ridge formed on juxtaposed surfaces of adjacent ones of the circuit layers 15 to secure an adjacent circuit component in a desired aligned position within its cavity or track so as to precisely locate each of the terminals 15c, 15d as well as other like terminals 15a-15d in the circuit layers 15 for connection either to one of the electrical devices on the upper housing 14 or to female terminator assemblies to be described. In the fragmentary view of FIG. 6, the upper terminal access board 20 has retention ridges 20e; electrical insulating board 42 has retention ridges 42d and electrical insulating board 44 has retention ridges 44b which will mate with circuit components of another of the circuit layers 15 (not shown). It should be understood that each retention rib overlies the full extent of an adjacent pre-stamped metal circuit component. FIG. 6 also shows hot upset segments 44c on electrical insulating board 44 for holding a circuit component 54 in a track 54a thereof. Hot upset segments 42e on board 42 hold a circuit component 56 in a track 56a of electrical insulating board 42.

Another aspect of the present invention is that the plurality of male terminals 15c that extend from each of the juxtaposed insulating layers of the circuit layers 15 through the upper terminal access board 20 must be centered and aligned for connection to each of the electronic and electrical devices such as the mini-fuses 22, maxi-fuses 24 and relays 26 on the housing 14. In order to accomplish such electrical connection without bending the terminals and by use of a minimum amount of force, in accordance with certain principles of the present invention, the housing 14 includes a plurality of terminal cavities 54, 56, 58 therein for the relays 26, the mini-fuses 22 and the maxi-fuses 24, respectively. One such terminal cavity is representatively illustrated at 60 in FIG. 4 with walls 62, 64. Each cavity is configured in a like manner and is associated with terminal components like a double ended female terminal 66 shown within terminal cavity 60.

The double ended female terminal 66 has a pair of opposite ends 66a, 66b forming converging walls for guiding mating male terminals into interlocking electrical engagement therewith. End 66a connects to spaced walls 66c, 66d at one end thereof and end 66b connects to a pair of spaced walls 66e and 66f. A spacing is formed between the pairs of walls 66c and 66d and 66e and 66f, which is wider than the thickness T of mating male terminal blades 68 and 70. The mating male terminal blade 68 is one terminal of a mini-fuse 22 and the mating male terminal blade 70 is formed at right angles with respect to a pre-stamped circuit component and is comparable to previously described male terminal blades 15a-15c of the circuit layers 15. The above-described configuration allows the terminal 66 to accept blades of varying material thickness. The pairs of walls 66c, 66d and 66e, 66f provide a gripping pressure that ensures constant electrical interface without relaxation in the terminal contact area.

The male terminal blades 68, 70 have tapered ends 68a and 70a which are directed through the ends 66a and 66b of the double ended female terminal 66 for low force entry therein during the assembly of the circuit layers 15 to the mini-fuses 22 to maxi-fuses 24 and relays 26. More particularly, and in accordance with the present invention, each of the mating terminals 15a-15d of the circuit layers 15 which engage the double ended female terminals 66 in each of the terminal cavities 54, 56, 58 has an offset segment 72 formed therein to produce a portion on each of the mating end terminals that has a width greater than the width of the thickness T of such male blade terminals but which is less than the spacing between terminal walls 66c-d and 66e-f. As representatively shown in FIG. 5 which shows an enlarged terminal blade 70, the offset segment 72 has a thickness greater than T to bridge between the spaced walls such as 66e, 66f at one end of the double ended female terminal 66. Such bridging provides a good electrical contact between the double ended female terminal 66 and the male terminal blade 70.

In addition to providing for a good electrical interface between the electrical devices on the upper housing 14 and the terminals of the circuit layers 15, the offset 72 will reduce the force required to couple the multiple terminal array of the circuit layers 15 to such devices. In FIG. 4, the upper housing 14 is shown as having a tapered guide hole 74 for entry of terminal 68. The walls 62, 64 have tips 76, 78 that reference against the outboard surface of the terminal access board 20.

The present invention also includes a centering and fastening capability which aligns the circuit layers 15 for connection to the devices while at the same time providing a connection for a protective shroud over all the circuits. The arrangement aligns each of the terminals 15a–15c into a low force mated relationship with the double ended female terminals 66.

Figure 9:
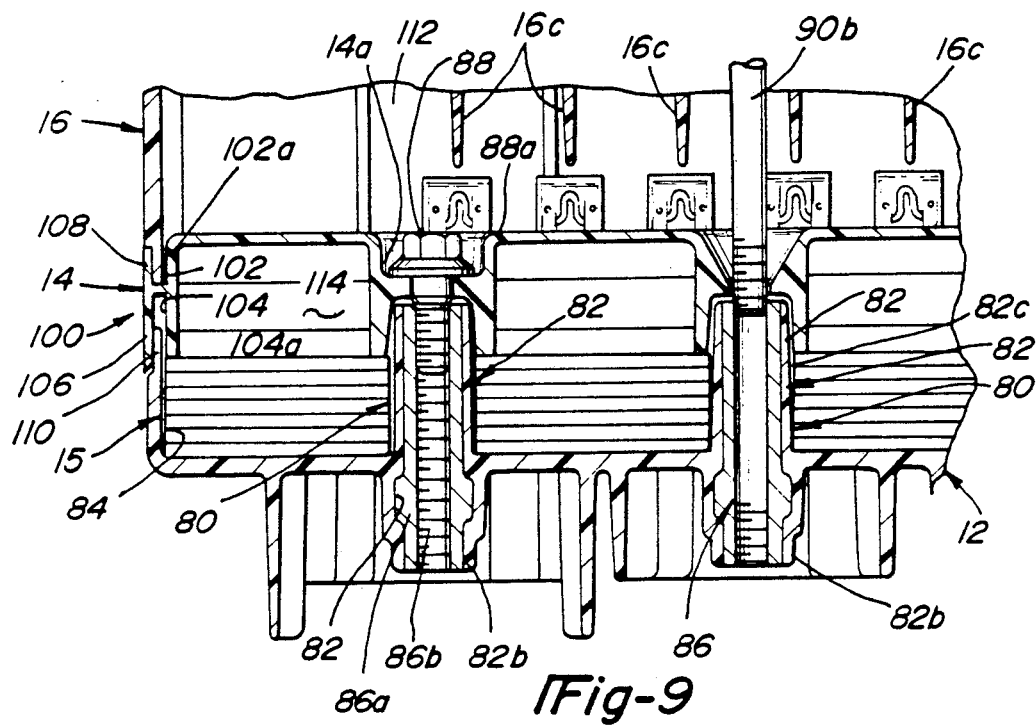
FIG. 9 is an enlarged fragmentary sectional view of a breathable enclosure formed between the lower and upper housing members and a cover thereon.

More particularly, to accomplish this objective, the lower housing member 12 has a plural guide system 80 formed integrally thereof. More particularly, the guide system 80 includes a hollow stem 82 having an inboard end 82a and an outboard end 82b. The inboard end 82a has a tapered outer surface 82c. Each of the circuit layers 15 has guide holes 38 formed at spaced points thereon that are adapted to align with the tapered surfaces 82c for locating each one of the circuit layers 15 in a centered relationship within a cavity 84 formed in the lower housing member 12 as best seen in FIG. 9. The interface between the tapered surface 82c and the guide openings 38 will position the male blade terminals 15, shown in FIG. 2, so as to be coaxially aligned with individual ones of the double ended female terminals 66 prior to connection of the upper housing member 14 to the lower housing member 12.

Figure 8:
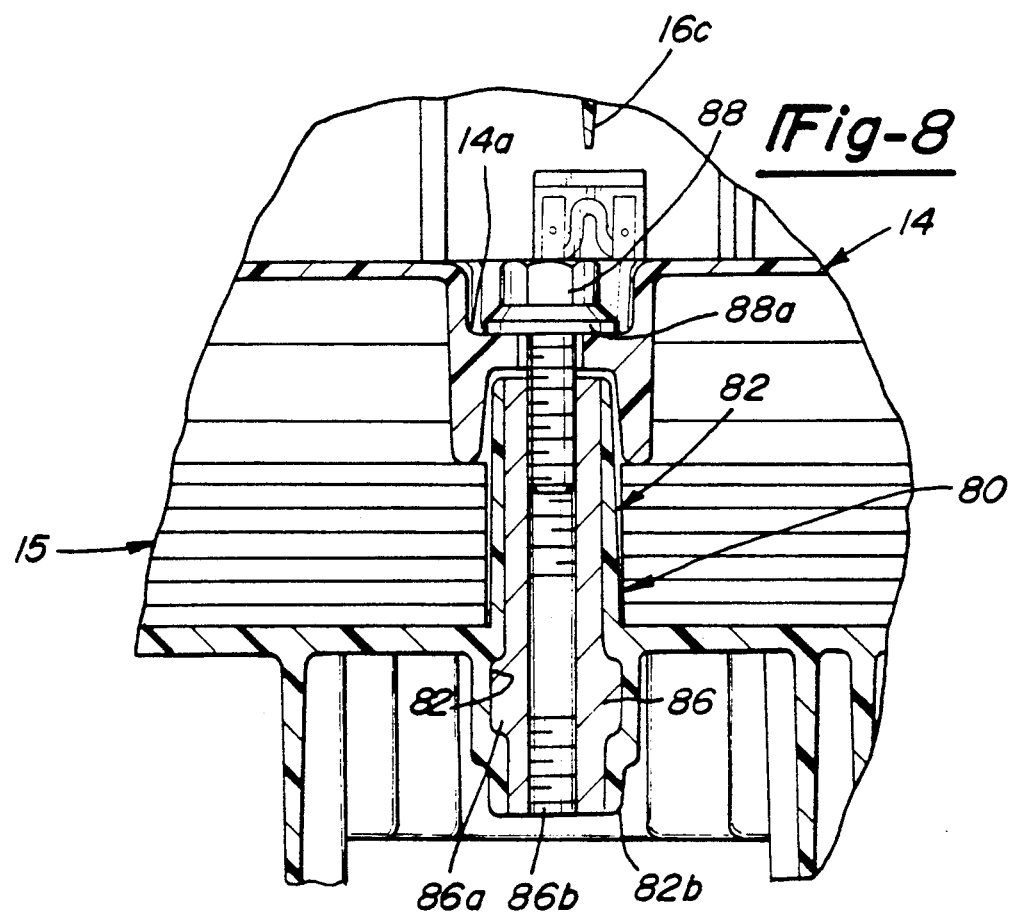
FIG. 8 is an enlarged fragmentary sectional view showing an interconnection between lower and upper housing members of the present invention.

In accordance with other principles of the present invention, each of the hollow stems 82 has a threaded insert 86 secured therein. Specifically, an annular fastening rib 86a on insert 86 is molded in situ of a groove 82d in the stem end 82b. The insert 86 has an interior thread 86b. The insert 86 in the outer stems 82 (one shown in FIGS. 8 and 9) threadably receives a fastener screw 88 having a head portion 88a in engagement with a recessed surface 14a of the housing 14 for securely holding the housing 14 to the housing 12.

A fastener 90 is interlocked to cover 16 at a handle 90a thereon. The fastener 90 has a stem 90b which extends through the interior of the housing to be threadably engaged with the insert 86 in the center stem 82.

A further feature of the present invention is a device hold down on the cover 16. The device hold down includes an inboard surface 16a which engages the upper surfaces of maxi-fuses 24, and an inboard surface 16b which engages the upper surfaces of the relays 26. Additionally, the cover 16 includes a plurality of ribs 16c thereon having a distal end that is located in close proximity to the upper surfaces of each of the mini-fuses 22. When the cover 16 is held in place by the fastener 90, the distal end of each of the ribs 16c will prevent the mini-fuses 22 from separating from the receptacles 20a in the housing 14. Likewise, the upper inboard surface 16a will be positioned to prevent separation of the maxi-fuses 24 and the relay bodies 26 from the housing 14. The aforesaid configuration of cover 16 keeps all the electrical devices in their proper location and ensures that the total electrical interface is completed between the devices and the double ended female terminals 66. The arrangement makes sure that the devices cannot back out to lose electrical integrity during use. Only when the cover is removed can devices be replaced or moved from their respective positions.

The cover 16 also carries a side shield 92 which is removably located on an integral flange 94 on the end of cover 16. A tether 96 formed integrally of side shield 92 snap fits to a tab 98 on cover 16. The tether 96 will prevent separation of the shield 92 from the cover 16 when the shield 92 is removed for providing access to the cable connector 27.

Another feature of the present invention is a breathable closure 100 formed around the perimeter of the electrical power distribution center 10 when the cover 90 is secured thereto. More particularly, as shown in FIG. 9, the breathable closure 100 includes a pair of oppositely facing grooves 102 and 104 in a perimeter flange 106 of the housing 14. The grooves 102, 104 respectively receive a reduced thickness edge 108 on the cover 16 and a reduced thickness edge 110 on the housing member 12. The edge 108 is located in the groove 102 to form a labyrinth passage 102a that will prevent the entry of moisture or dirt from exteriorly of the power distribution center 10 into the interior space 112 formed between the cover 16 and the upper housing member 14. Likewise, the edge 110 and groove 104 are dimensioned to provide a labyrinth passage 104a to prevent the entry of moisture and dirt into the cavity space 114 formed between the housings 12, 14. The labyrinth spaces 102a and 104a provide a breathing space that enables air within the spaces 112, 114 to expand and contract during operation of the electrical power distribution center 10 as it is heated or cooled during its operation. The breathable enclosure 100 provides a more even control of temperature levels and atmospheric conditions within the power center thereby to provide a more stable electrical environment therein.

A still further feature of the present invention is the provision of a plurality of terminal receptacles 116, 118, 120 formed on the base 122 of the lower housing member 12, as best seen in FIG. 11. Each of the terminal receptacles 116–120 includes a cavity 116a, 118a, 120a adapted to receive a female terminator assembly 124 shown in FIG. 12. Each receptacle 116–120 has a pair of spaced walls 126, 128 that define a wide entrance opening into the receptacles 116–120. The wide entrance opening locates a female terminator assembly 124 within its mating terminal receptacle 116–120. The initial wide opening is reduced by the width of the end 82b of the hollow guide stem 82 as the end surface 124a of the female terminator enters its mating receptacle. The dimensional reduction in the area of the cavities 116a–120a causes each of a plurality of female terminals 124b in the female terminator assembly 124 to be aligned with one of the male terminal blades 15d that are concentrated within the cavities 116a–120a as illustrated. Additionally, in order to assure that the female terminator assemblies 124 are physically retained in a proper electrically connected location and totally electrically seated with respect to the male blades 15c, each of the female terminator assemblies 124 carries a screw fastener 130 that has a head portion 126a engaged with an outer surface 124c of the female terminator assembly 124 and a threaded end 126b thereon threadably engaged with the threaded insert 86 in one of the hollow guide stems 82. Finally, the female terminator assemblies 124 are physically restricted on both ends by rigid plastic surfaces 124c, 124d, all of which combine to positively capture all of the female terminator assemblies 124 in an exact location with respect to the male terminal blades 15d.

Accordingly, as described above, a centralized electrical power distribution center for multi-functional devices is provided. The stacked circuit layers 15 have pre-stamped, replaceable metal circuit components of varying widths, thicknesses and materials which follow electrically insulated routings to eliminate the need for wire splices between electrical devices on the power center and the separate circuits of an automotive wiring system. The circuits are capable of handling both high and low current levels and the resultant package enables a maximum current carrying capacity to be achieved in a minimum surface area configuration. Accordingly, the design achieves an overall high density of packaging of the power center components and power can be supplied to various multi-functional devices such as maxi-fuses, mini-fuses and mini-relays from a single power source.

Multiples of similar circuit arrays can be provided in each of the stacked circuit layers 15, the stamped circuit components allow a greater thermal dissipation of heat to occur and, if desired, additional heat sinks such as a heat sink 130 shown in FIG. 10 can be provided to provide for direct heat dissipation away from the circuit component.

The density and alignment of the ends of the circuits are such that electrical interfaces to other electrical connections may be interfaced to each other either by snap connected electrical connections or by bolting the various electrical interconnects together at one time.

Each of the circuit layers 15 may be individually removed from the remaining layers or individual circuit components 30 can be individually removed from the remaining layers or individual circuit layers 15 without affecting other portions of the design thereby to provide a high level of interchangeability. As a consequence, very versatile power distribution systems provide the capability of accommodating various options or subsystems in an automotive type electrical system as desired.

Although the invention has been described by use of specific terminology, it is to be noted that the described embodiments are only illustrative and various changes and modifications may be imparted thereto without departing from the scope of the invention which is limited solely by the appended claims.

What is claimed is:

1. An electrical power distribution center for providing electrical interconnections between electrical and electronic devices and electrical wiring connections comprising:

a plurality of electrical insulation boards each having opposite surfaces located in juxtaposed relationship with one another;

housing means including a lower housing and an upper housing for containing said electrical insulation boards;

a plurality of pre-stamped metal circuit components each having a first plurality of terminals on one end thereof extending transversely of said electrical insulation boards in a first direction and through said lower housing for connection to a wiring connection; said plurality of pre-stamped metal circuit components each having a second plurality of terminals on the opposite end thereof extending transversely of said electrical insulation boards in a direction opposite to said first direction and into said upper housing for connection to an electrical or electronic device on said upper housing;

one surface of said electrical insulation boards having a plurality of cavities therein formed to receive said stamped metal circuit components and the other surfaces of each of said electrical insulation boards having means thereon to close said cavities to hold said pre-stamped metal circuit components in place in said plurality of cavities and to electrically insulate each of said pre-stamped metal circuit components one from the other to form different current carrying capacities in each of said electrical insulation boards.

2. The electrical power distribution center of claim 1 characterized by having a power bus disposed beneath said upper housing and formed as a flat plate having a plurality of terminals extending transversely of the electrical insulation boards and into said upper housing for connection to an electrical device on said upper housing;

said upper housing having means engageable with said power bus and means for receiving terminals of said pre-stamped metal circuit components and said power bus adapted to be connected to an electrical or electronic device.

3. The electrical power distribution center of claim 1 characterized by said lower housing having means thereon for centering each of said electrical insulation boards with respect thereto as they are disposed between said lower and upper housings, said means comprising a plurality of hollow stems having surfaces inboard of the lower housing and each of the electrical insulation boards having guide holes aligned with the surfaces of respective ones of the hollow stems.

4. The electrical distribution center of claim 1 characterized by said lower housing having means therein for receiving terminals of said pre-stamped metal circuit components adapted to be connected to the electrical wiring connections and for locating said last mentioned terminals exteriorly of said lower housing for connection to such electrical wiring connections.

5. The electrical power distribution center of claim 1 characterized by double ended female terminal means being located within said upper housing for electrically connecting terminals on an electrical or electronic device to terminals of said pre-stamped metal circuit components.

6. The electrical power distribution center of claim 5 characterized by male terminals formed on said pre-stamped metal circuit components adapted to be received by one end of said double ended female terminal means; said double ended female terminal means having a mating interface with an opening therethrough; the thickness of said male terminals being less than said mating interface opening and means forming an offset within a portion of the length of said male terminals to provide a limited area of surface contact with said mating interface to minimize the force required to engage said male terminals to said double ended female terminal means.

7. An electrical power distribution center for providing electrical interconnections between electrical and electronic devices and electrical wiring connections comprising:

a plurality of electrical insulation boards each having opposite surfaces located in juxtaposed relationship with one another;

housing means including a lower housing and an upper housing for containing said electrical insulation boards;

a plurality of pre-stamped metal circuit components each having a first plurality of terminals on one end thereof extending transversely of said electrical insulation boards in a first direction and through said lower housing for connection to a wiring connection; said plurality of pre-stamped metal circuit components each having a second plurality of terminals on the opposite end thereof extending transversely of said electrical insulation boards in a direction opposite to said first direction and into said upper housing for connection to an electrical or electronic device on said upper housing;

one surface of said electrical insulation boards having a plurality of cavities therein formed to receive said stamped metal circuit components and the other surfaces of each of said electrical insulation boards having means thereon to close said cavities to hold said pre-stamped metal circuit components in place in said plurality of cavities and to electrically insulate each of said pre-stamped metal circuit components one from the other to form different current carrying capacities in each of said electrical insulation boards;

characterized by electrical devices carried by the upper housing; cover means connected to said upper housing and including a plurality of ribs thereon extending toward said upper housing and having a length to be located closely adjacent the upper surface of each of the electrical devices carried by said upper housing for maintaining each of the electrical devices in their proper position on said upper housing when said cover means is secured thereto.

8. The electrical power distribution center of claim 1, characterized by said lower housing having receptacle means thereon with a plurality of male terminals therein integral with said pre-stamped metal circuit components, said receptacle means having surfaces thereon adapted to receive a female terminator and for guiding said female terminator into said receptacle means for simultaneously centering the female terminator with each of said plurality of male terminals and means for threadably connecting each of said female terminators to said upper housing when said male terminals are all connected to the female terminator for positively securing the female terminators in an exact location for electrically connecting wires thereof to said pre-stamped metal circuit components.

9. An electrical power distribution center for providing electrical interconnections between electrical and electronic devices and electrical wiring connections comprising:

a plurality of electrical insulation boards each having opposite surfaces located in juxtaposed relationship with one another;

housing means including a lower housing and an upper housing for containing said electrical insulation boards;

a plurality of pre-stamped metal circuit components each having a first plurality of terminals on one end thereof extending transversely of said electrical insulation boards in a first direction and through said lower housing for connection to a wiring connection; said plurality of pre-stamped metal circuit components each having a second plurality of terminals on the opposite end thereof extending transversely of said electrical insulation boards in a direction opposite to said first direction and into said upper housing for connection to an electrical or electronic device on said upper housing;

one surface of said electrical insulation boards having a plurality of cavities therein formed to receive said stamped metal circuit components and the other surfaces of each of said electrical insulation boards having means thereon to close said cavities to hold said pre-stamped metal circuit components in place in said plurality of cavities and to electrically insulate each of said pre-stamped metal circuit components one from the other to form different current carrying capacities in each of said electrical insulation boards;

characterized by said lower housing having a plurality of hollow stems having a first end segment located outboard of said lower housing and having a second end segment located inboard of said lower housing;

means formed within said hollow stems adapted to be connected to fastening means for holding the upper housing to said lower housing and for holding electrical wiring connectors to the exterior of said lower housing.

10. The electrical power distribution center of claim 9, characterized by said first end having a tapered outer surface and means forming guide holes in each of said stacked electrical insulating boards for receiving said tapered outer surface for aligning said insulating boards and said pre-stamped metal circuits and terminals thereon with respect to said terminal access holes in said upper and lower housings.

11. The electrical power distribution center of claim 7, characterized by enclosure means for connecting said cover to said upper housing and for connecting said upper housing to said lower housing, said enclosure means allowing the interior of said center to breathe in accordance with changes in the interior air temperature therein produced by the current flow through said pre-stamped metal circuits.

12. An electrical power distribution center for providing electrical interconnections between electrical and electronic devices and electrical wiring connections comprising:

a housing including an upper housing member and a lower housing member;

a plurality of electrical insulation boards with electrical conductors supported thereon for directing current from a power source to the electrical and electronic devices and to the electrical wiring connections; each of said electrical insulation boards having opposite surfaces located in juxtaposed relationship with one another; and means formed between said upper housing member and said lower housing member to prevent entry of ambient material from exterior of said housing means to the interior thereof while allowing for expansion and discharge of air from the interior of said housing means during operation of said circuit boards within said housing.

13. An electrical power distribution center for providing electrical interconnections between electrical and electronic devices and electrical wiring connections for directing power to electrical systems for automobiles without the need for external splices between the wiring harnesses for the electrical systems and the electrical distribution center comprising:
- a housing including lower and upper housing members and a cover;
- a plurality of electrical insulation boards with removable circuit components thereon with end terminals connectable wither to the electrical and electronic devices or to the electrical wiring connections each having opposite surfaces located in juxtaposed relationship with one another;
- predetermined ones of said removable circuit components further having a first plurality of terminals on one end thereof extending transversely of said electrical insulation boards in a first direction and through said lower housing member for connection to a wiring connection; predetermined others of said removable circuit components having a second plurality of terminals on the opposite end thereof extending transversely of said electrical insulation boards in a direction opposite to said first direction and into said upper housing member for connection to an electrical or electronic device on said upper housing member.

14. The electrical power distribution center of claim 13 characterized by said upper housing having means thereon engageable with the upper most one of said stacked electrical insulation boards and means forming a plurality of cavities for receiving terminals of said removable circuit components adapted to be connected to an electrical or electronic device.

15. The electrical power distribution enter of claim 14 characterized by double ended female terminal means being located within said cavities for electrically connecting a terminal on an electrical or electronic device to one of said terminals of said removable circuit components adapted to be connected to the electrical or electronic device.

16. The electrical power distribution center of claim 15 characterized by having male terminals formed on said removable circuit components adapted to be received by one end of said double ended female terminal means; said double ended female terminal means having a mating interface opening therethrough; the thickness of said male terminals being less than said mating interface opening and means forming an offset within a portion of the length of said male terminal means to provide a limited area of surface contact with said mating interface to minimize the force required to engage said male terminals.

17. An electrical power distribution center for providing electrical interconnections between electrical and electronic devices and electrical wiring connections for directing power to electrical systems for automobiles without the need for external splices between the wiring harnesses for the electrical systems and the electrical distribution center comprising:
- a housing including lower and upper housing members and a cover;
- a plurality of electrical insulation boards with removable circuit components thereon with end terminals connectable wither to the electrical and electronic devices or to the electrical wiring connections each having opposite surfaces located in juxtaposed relationship with one another;
- predetermined ones of said removable circuit components further having a first plurality of terminals on one end thereof extending transversely of said electrical insulation boards in a first direction and through said lower housing member for connection to a wiring connection; predetermined others of said removable circuit components having a second plurality of terminals on the opposite end thereof extending transversely of said electrical insulation boards in a direction opposite to said first direction and into said upper housing member for connection to an electrical or electronic device on said upper housing member;
- characterized by said cover connected to said upper housing member including a plurality of ribs therein extending toward said upper housing member and having a length to be located closely adjacent electrical devices carried by said upper housing for maintaining the electrical devices in their proper position on said upper housing member when said cover means is secured thereto.

18. An electrical power distribution center for providing electrical interconnections between electrical and electronic devices and electrical wiring connections for directing power to electrical systems for automobiles without the need for external splices between the wiring harnesses for the electrical systems and the electrical distribution center comprising:
- a housing including lower and upper housing members and a cover;
- a plurality of electrical insulation boards with removable circuit components thereon with end terminals connectable wither to the electrical and electronic devices or to the electrical wiring connections each having opposite surfaces located in juxtaposed relationship with one another;
- predetermined ones of said removable circuit components further having a first plurality of terminals on one end thereof extending transversely of said electrical insulation boards in a first direction and through said lower housing member for connection to a wiring connection; predetermined others of said removable circuit components having a second plurality of terminals on the opposite end thereof extending transversely of said electrical insulation boards in a direction opposite to said first direction and into said upper housing member for connection to an electrical or electronic device on said upper housing member;
- characterized by said lower housing member having receptacle means thereon with a plurality of male terminals therein connected to said removable circuit components, said receptacle means having surfaces thereon adapted to receive a female terminator assembly and for guiding said female terminator assembly into said receptacle means for centering the female terminator assembly thereon with each of said plurality of male terminals simultaneously and means for threadably connecting each of said female terminator assemblies to said lower housing member when said male terminals are all connected to said female terminator assemblies.

19. The electrical power distribution center of claim 13, characterized by said lower housing member having a plurality of hollow stems having a first end segment located outboard of said lower housing and having a second end segment located inboard of said lower housing;

means formed within said hollow stems adapted to be connected to fastening means for holding the upper housing member to said lower housing member and for holding electrical wiring connectors to said lower housing member.

20. The electrical power distribution center of claim 19, characterized by said first end segment having a tapered outer surface and means forming guide holes in each of said stacked electrical insulating boards for receiving said tapered outer surface for centering said electrical insulating boards and said pre-stamped metal circuit components and terminals thereon with respect to said lower and upper housing members.

21. The electrical power distribution center of claim 17, characterized by enclosure means for connecting a cover to said lower housing member and for connecting said lower housing member to said upper housing member, said enclosure means allowing the center to breathe in accordance with changes in the interior air temperature therein produced by the current flow through said removable circuit components.

22. The electrical device as defined in claim 3 further including means formed within said hollow stems adapted to be connected to fastening means for holding the upper housing to the lower housing.

23. The electrical device as defined in claim 3 further including a cover and means formed within said hollow stems adapted to be connected to fastening means for holding the upper housing to the lower housing and the cover to the upper housing.

24. The electrical connector of claim 12 wherein the means is characterized by the upper housing member having a perimeter flange that includes a groove that receives a reduced thickness edge of the lower housing member to form a labyrinth passage.

25. The electrical connector of claim 21 wherein the means is characterized by the upper housing member having a perimeter flange that includes a pair of oppositely facing grooves that receive reduced thickness edges of the cover and the lower housing member respectively to form labyrinth passages for exiting the interior of the cover and the interior of the housing respectively.

* * * * *